(12) United States Patent
Murin

(10) Patent No.: US 7,616,483 B2
(45) Date of Patent: Nov. 10, 2009

(54) MULTI-BIT-PER-CELL FLASH MEMORY DEVICE WITH AN EXTENDED SET OF COMMANDS

(75) Inventor: Mark Murin, Kfar Saba (IL)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/785,302

(22) Filed: Apr. 17, 2007

(65) Prior Publication Data

US 2008/0002465 A1 Jan. 3, 2008

Related U.S. Application Data

(60) Provisional application No. 60/806,477, filed on Jul. 3, 2006.

(51) Int. Cl.
*G11C 16/04* (2006.01)

(52) U.S. Cl. .............................. 365/185.03; 365/185.2; 365/185.24; 365/185.33

(58) Field of Classification Search .............. 365/185.2, 365/185.03, 185.24, 185.33
See application file for complete search history.

(56) References Cited

U.S. PATENT DOCUMENTS

| | | | | |
|---|---|---|---|---|
| 6,084,797 A * | 7/2000 | Maloberti et al. ...... | 365/189.15 |
| 6,119,252 A * | 9/2000 | Roohparvar et al. ........ | 714/721 |
| 6,385,112 B1 * | 5/2002 | Kurosaki ............... | 365/185.33 |
| 6,649,931 B2 * | 11/2003 | Honma et al. ............... | 257/48 |
| 6,683,767 B2 * | 1/2004 | Ito et al. ....................... | 361/56 |
| 6,744,689 B2 * | 6/2004 | Itou ........................... | 365/228 |
| 6,747,894 B2 * | 6/2004 | Kawamura ............. | 365/185.03 |
| 6,819,596 B2 * | 11/2004 | Ikehashi et al. ........ | 365/185.22 |
| 7,020,017 B2 * | 3/2006 | Chen et al. ............. | 365/185.03 |
| 7,102,933 B2 * | 9/2006 | Minzoni ................. | 365/189.05 |
| 7,190,606 B2 * | 3/2007 | Kang ......................... | 365/145 |
| 7,196,945 B2 * | 3/2007 | Kato ...................... | 365/189.07 |
| 7,299,380 B2 * | 11/2007 | Miller ........................ | 714/25 |
| 7,417,838 B2 * | 8/2008 | Ito et al. ...................... | 361/56 |
| 2007/0237006 A1 * | 10/2007 | Murin et al. ........... | 365/189.01 |

OTHER PUBLICATIONS

U.S. Appl. No. 11/651,483, filed Oct. 2007, Murin; Mark; et al.
Notification Concerning Transmittal of International Preliminary Report on Patentability and Written Opinion of the International Searching Authority dated Mar. 26, 2009 in PCT Patent Application No. PCT/IL2007/000814.

* cited by examiner

*Primary Examiner*—Viet Q Nguyen
(74) *Attorney, Agent, or Firm*—Vierra Magen Marcus & DeNiro LLP

(57) ABSTRACT

A multi-bit-per-cell flash memory device supports a command such that each invocation of the command by the device's host changes respective values of one or more types of reference voltage (e.g., all read reference voltages and/or all program verify reference voltages) of the device to respective new values.

26 Claims, 1 Drawing Sheet

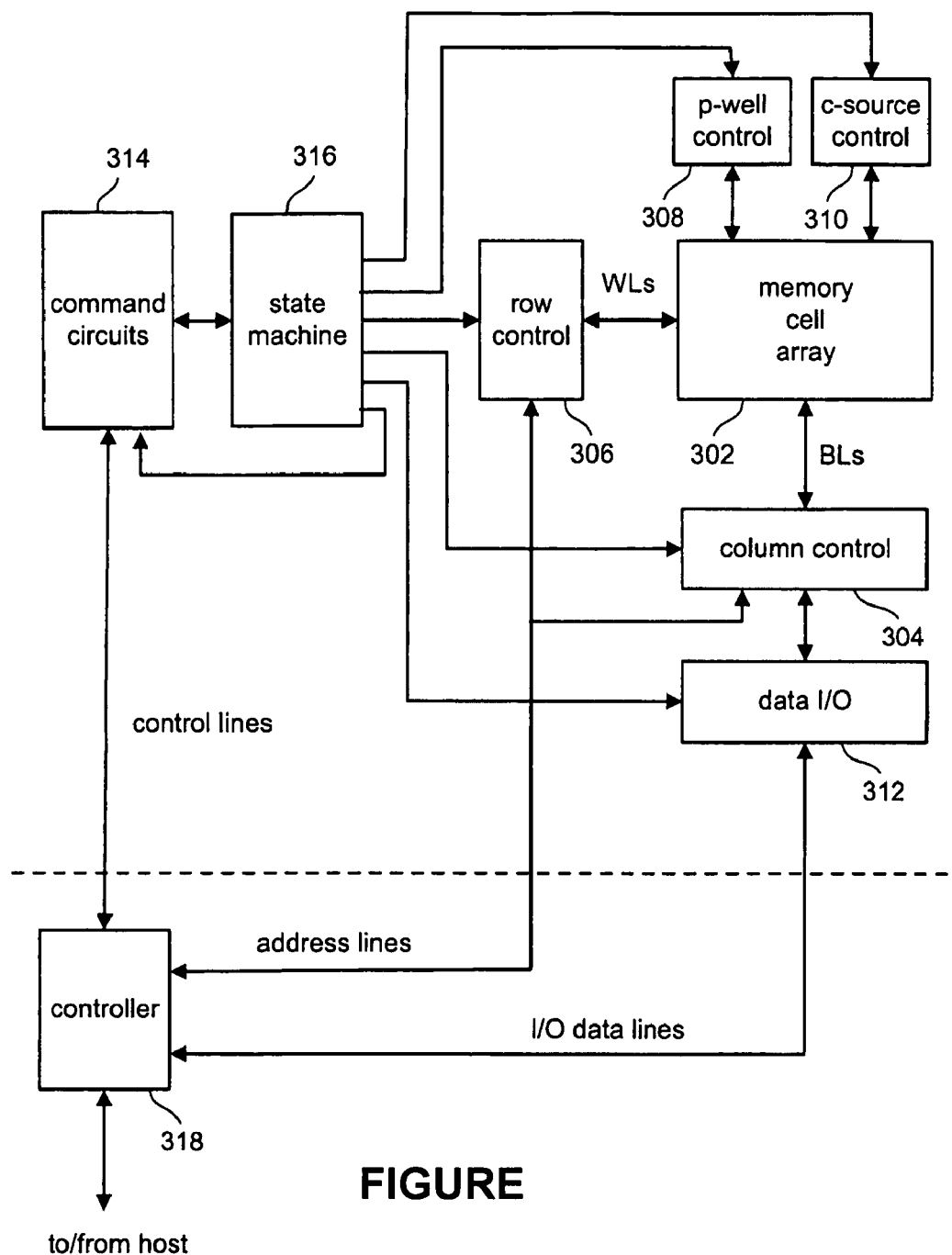
FIGURE

MULTI-BIT-PER-CELL FLASH MEMORY DEVICE WITH AN EXTENDED SET OF COMMANDS

This patent application claims the benefit of U.S. Provisional Patent Application No. 60/806,477, filed Jul. 3, 2006

FIELD AND BACKGROUND OF THE INVENTION

The present invention relates to multi-bit-per-cell Flash memory devices, particularly NAND Flash memory devices, with an extended set of commands that enables efficient modification of Flash internal parameter values, in order to achieve improved device performance in "real life" operation.

NAND Flash memory devices, available in the market, are operated using a command set that allows execution of basic Flash operations, such as Page read, Page program, Block erase and Status and ID read. Different devices from different vendors may contain slight variations on this command set, but there is always a common group of commands, implemented in all the devices—this group of commands allows execution of the basic operations as mentioned above. As an example, a device MT29F2G08AABWP, manufactured by Micron Technology of Boise, Id., USA, may be considered. A data sheet of this device is available on request from Micron Technology. The following device commands are listed on page 22 of the MT29F2G08AABWP data sheet:

PAGE READ
PAGE READ CACHE MODE START
PAGE READ CACHE MODE START LAST
READ for INTERNAL DATA MOVE
RANDOM DATA READ
READ ID
READ STATUS
PROGRAM PAGE
PROGRAM PAGE CACHE
PROGRAM for INTERNAL DATA MOVE
RANDOM DATA INPUT for PROGRAM
BLOCK ERASE
RESET In addition to the "standard" command set that is generally available for the applications, Flash vendors usually implement a set of additional "special" commands for setting values of internal parameters of the Flash operation. These commands are intended to ease debugging and evaluation processes of the Flash device, and as such address each Flash parameter separately, a single parameter per command.

As an example of internal Flash device parameters whose values are set by such "special" commands, one may consider programming and read parameters such as read reference voltages, program verify reference voltages, programming voltage steps, etc., as described in Chen et al., U.S. Pat. No. 7,020,017. This patent is incorporated herein by reference for all purposes as if fully set forth herein.

However, as the Chen et al. patent suggests, it is sometimes important to modify internal parameter values of a Flash memory device not only for development purposes, but also as a standard practice in a "real life" operation of the Flash memory device. The Chen et al. patent suggests using different settings of Flash parameter values when handling different pages of the Flash memory device, as a countermeasure for a phenomenon of different reliability exhibited by different Word Lines in the Flash memory. Specifically, the Chen et al. patent teaches using different values of read reference voltages and/or program verify reference voltages for different word lines of a multi-bit-per-cell Flash memory device.

Another example for the need to modify Flash parameter values in real life applications may be found in an U.S. patent application Ser. No. 11/651,483 "METHOD FOR GENERATING SOFT BITS IN FLASH MEMORIES" to Murin et al. This patent application is incorporated herein by reference for all purposes as if fully set forth herein.

As the Murin et al. patent application suggests, in order to obtain Soft Bit information for ECC computation, several readings of the Flash data with different read references for all voltages levels should be performed.

In all of the cases described above (changing of Word Line programming settings or reading information for computation of Soft Bits), modification of the values of the multiple Flash parameters (read voltages, program verify voltages, programming parameters) is currently done one-by-one, using "special commands" acceptable by the Flash. However, because numerous parameter values have to be changed for every mode change (especially in a multi-bit-per-cell device, in which the number of voltage level parameters grows exponentially with the number of bits stored in each cell), the operation of changing parameter values is quite cumbersome for the application and is also time consuming.

There is thus a widely recognized need for, and it would be highly advantageous to have, a way of changing a full set of Flash parameter values by an application in an efficient way, without the need of issuing a large number of special commands for effecting the mode change.

SUMMARY OF THE INVENTION

According to the present invention there is provided a multi-bit-per-cell flash memory device that supports a command such that each invocation of the command, by a host of the flash memory device, changes respective present values of all reference voltages, of at least one type, of the flash memory device to respective new values of the reference voltages.

Preferably, the command changes respective present values of all reference voltages of a single type. For example, in some preferred embodiments of the present invention the command changes respective present values of all read reference voltages or of all program verify reference voltages. Alternatively, the command changes respective present values of all read reference voltages and of all program verify reference voltage.

In one class of preferred embodiments of the present invention, the command has a single argument. Preferably, the flash memory includes a plurality of stored sets of values of the reference voltages of the at least one type, and the single argument is an index of one of the stored sets, so that the new values are the values of the indicated stored set. Alternatively, the single argument is a value to be combined, by an arithmetic operation such as addition (or, equivalently, subtraction if the value is negative) or multiplication (or, equivalently, division if the value is less than 1 in absolute value), with a respective value associated with each reference voltage of the at least one type to yield the new values. Most preferably, the associated values are either default values of the reference voltages of the at least one type or present values of the reference voltages of the at least one type.

In another class of preferred embodiments of the present invention, the command has a plurality of arguments, equal in number to the reference voltages of the at least one type. Preferably, the arguments are the new values. Alternatively, the arguments are first respective values to be combined, by a common arithmetic operation such as addition or multiplication, with second respective values associated with the reference voltages of the at least one type to yield the new values. Most preferably, the second respective values are either default values of the reference voltages of the at least one type or present values of the reference voltages of the at least one type.

BRIEF DESCRIPTION OF THE DRAWINGS

The invention is herein described, by way of example only, with reference to the accompanying drawings, wherein:

The sole FIGURE is a block diagram of a Flash memory device of the present invention.

DESCRIPTION OF THE PREFERRED EMBODIMENTS

The principles and operation of a Flash memory device according to the present invention may be better understood with reference to the drawings and the accompanying description.

In order to achieve the above-mentioned goal of concurrently modifying a set of Flash parameter values in an efficient manner, the present invention groups various related parameters, whose values are subject to concurrent change by an application, and assigns to such a group of parameters a corresponding Flash command that, when issued by an application, modifies the values of all the parameters in the group in one operation.

Various parameter groups and various methods of the command operation may be implemented. The following are examples of the parameter grouping:

A group of all read reference voltages in a multi-bit-per-cell flash memory.

A group of all program verify reference voltages in a multi-bit-per-cell flash memory.

A group combining both all read references voltages and all program verify reference voltages in a multi-bit-per-cell flash memory.

All three groups may be used to advantage in conjunction with different word lines, as described in the Chen et al. patent. The first group (setting all read reference voltages for all voltage levels) may be used to advantage when obtaining data from the Flash memory for "Soft Bit" computation, as described in the Murin et al. patent application.

The following are possible methods of configuring the special commands that affect the multiple parameter value setting operation:

The command selects one set of parameter values out of several sets, where all parameter values of all sets are preset in advance. For example, the command instructs the flash device to activate set No. 3 of read reference voltages out of 5 possible sets, and the device is designed to know which value of each read reference voltage corresponds to set No. 3.

The command selects an additive or multiplicative offset value for each one of the parameters in the set, where the offset value is specified in the command as a part of the command syntax. The offset may be relative to a default value or relative to the current value. The offset may be the same for all parameters in the group or different for different parameters. For example, the command instructs the Flash device to increase all current read reference voltages by 100 millivolts, or instructs the Flash device to multiply all current read reference voltages by 1.05.

The command explicitly specifies values for each one of the parameters in the group, where these values are part of the command syntax.

It should be noted, that the present invention may be implemented in different ways—by designing new commands for a Flash memory device, by writing corresponding data (i.e. parameter set selection or parameter values) to a configuration register in the Flash memory device, or by using existing commands with newly implemented command prefixes that specify specific non-default sets of parameters to be used by the Flash memory device.

The FIGURE, that is based on FIG. 5 of the Chen et al. patent, is a block diagram of one embodiment of a (preferably) multi-bit-per-cell Flash memory device of the present invention. A memory cell array 302 is controlled by a column control circuit 304, a row control circuit 306, a c-source control circuit 310 and a p-well control circuit 308. Column control circuit 304 is connected to the bit lines (BLs) of memory cell array 302 for reading data stored in the memory cells of memory cell array 302, for determining a state of the memory cells during a program operation, and for controlling potential levels of the bit lines to promote the programming or to inhibit the programming. Row control circuit 306 is connected to the word lines (WLs) of memory cell array 302 to select one of the word lines, to apply read voltages, to apply program voltages combined with the bit line potential levels controlled by column control circuit 304, and to apply an erase voltage. A C-source control circuit 310 controls a common source line connected to the memory cells. A P-well control circuit 308 controls the p-well voltage.

The data stored in the memory cells are read out by column control circuit 304 and are output to external I/O lines via a data input/output buffer 312. Program data to be stored in the memory cells are input to data input/output buffer 312 via the external I/O lines, and are transferred to column control circuit 304. The external I/O lines are connected to a controller 318.

Command data for controlling the flash memory device are input to controller 318. The command data informs the flash memory of what operation is requested. The input command is transferred to a state machine 316 that controls column control circuit 304, row control circuit 306, c-source control circuit 310, p-well control circuit 308 and data input/output buffer 312. State machine 316 can also output status data of the flash memory such as READY/BUSY or PASS/FAIL.

Controller 318 is connected to or connectable with a host system (not shown) such as a personal computer, a digital camera, or personal digital assistant, etc. Controller 318 communicates with the host that initiates commands, such as to store or read data to or from the memory array 302, and provides or receives such data. Controller 318 converts such commands into command signals that can be interpreted and executed by command circuits 314 that are in communication with state machine 316. Controller 318 typically contains buffer memory for the user data being written to or read from memory cell array 302.

Controller 318 supports all the prior art host commands that are described in the Field and Background section above. Controller 318 also supports multi-parameter commands of the present invention.

While the invention has been described with respect to a limited number of embodiments, it will be appreciated that many variations, modifications and other applications of the invention may be made.

What is claimed is:

1. A multi-bit-per-cell flash memory device that supports a command such that each invocation of the command, by a host of the flash memory device, changes respective present values of all reference voltages, of at least one type, of the flash memory device to respective new values of the reference voltages.

2. The flash memory device of claim 1, wherein the command changes respective present values of all reference voltages of a single type.

3. The flash memory device of claim 2, wherein the command changes respective present values of all read reference voltages of the flash memory device.

4. The flash memory device of claim 2, wherein the command changes respective present values of all program verify reference voltages of the flash memory device.

5. The flash memory device of claim 1, wherein the command changes respective present values of all read reference voltages and of all program verify reference voltages of the flash memory device.

6. The flash memory device of claim 1, wherein the command has a single argument.

7. The flash memory device of claim 6, wherein the flash memory device includes a plurality of stored sets of values of the reference voltages of the at least one type and wherein said single argument is an index of one of said stored sets.

8. The flash memory device of claim 6, wherein said argument is a value to be combined, by an arithmetic operation, with a respective value associated with each reference voltage of the at least one type, to yield said new value of said each reference voltage of the at least one type.

9. The flash memory device of claim 8, wherein said respective associated values are default values of the reference voltages of the at least one type.

10. The flash memory device of claim 8, wherein said respective associated values are present values of the reference voltages of the at least one type.

11. The flash memory device of claim 8, wherein said arithmetic operation is addition.

12. The flash memory device of claim 8, wherein said arithmetic operation is multiplication.

13. The flash memory device of claim 1, wherein the command has a plurality of arguments, equal in number to the reference voltages of the at least one type.

14. The flash memory device of claim 13, wherein said arguments are the new values of the reference voltages of the at least one type.

15. The flash memory device of claim 13, wherein said arguments are first respective values to be combined, by a common arithmetic operation, with second respective values associated with the reference voltages of the at least one type to yield the new respective values of the reference voltages of the at least one type.

16. The flash memory device of claim 15, wherein said second respective values are default values of the reference voltages of the at least one type.

17. The flash memory device of claim 15, wherein said second respective values are present values of the reference voltages of the at least one type.

18. The flash memory device of claim 15, wherein said arithmetic operation is addition.

19. The flash memory device of claim 15, wherein said arithmetic operation is multiplication.

20. A storage device comprising:
a memory array including non-voltage storage elements; and
management circuitry coupled to the memory array, the management circuitry stores multiple bits of data per non-volatile storage element, the management circuitry receives a command from a host coupled to the storage device, the management circuitry changes present values of at least one type of all reference voltages of the storage device to new values in response to receiving the command.

21. The storage device of claim 20, wherein the management circuitry changes present values of all read reference voltages of the storage device to said new values in response to receiving the command.

22. The storage device of claim 20, wherein the management circuitry changes present values of all program verify reference voltages of the storage device to said new values in response to receiving the command.

23. The storage device of claim 20, wherein said command has an argument value, said management circuitry performs an arithmetic operation to combine said argument value with a value associated with each reference voltage of the at least one type to yield said new value of said each reference voltage of the at least one type.

24. The storage device of claim 23, wherein said arithmetic operation is either addition or multiplication.

25. The storage device of claim 20, wherein the command has a plurality of argument values, said management circuitry performs an arithmetic operation to combine each of the argument values with a value associated with respective ones of the reference voltage of the at least one type to yield said new value of said each reference voltage of the at least one type.

26. The storage device of claim 25, wherein said arithmetic operation is either addition or multiplication.

* * * * *